(12) United States Patent
Taylor et al.

(10) Patent No.: US 7,456,667 B2
(45) Date of Patent: Nov. 25, 2008

(54) ELECTRICAL SIGNAL DUTY CYCLE MODIFICATION

(76) Inventors: Stewart S. Taylor, 16927 NW. Hazelgrove Ct., Beaverton, OR (US) 97006; Jing-Hong C Zhan, 1, Alley 11, Lane 69, Kung Hua 2nd St., HsinChu, 300 (TW)

( * ) Notice: Subject to any disclaimer, the term of this patent is extended or adjusted under 35 U.S.C. 154(b) by 80 days.

(21) Appl. No.: 11/644,284

(22) Filed: Dec. 22, 2006

(65) Prior Publication Data

US 2008/0150600 A1    Jun. 26, 2008

(51) Int. Cl.
*H03K 3/017*    (2006.01)
(52) U.S. Cl. .................. 327/175; 327/172; 327/263; 327/284
(58) Field of Classification Search .................. None
See application file for complete search history.

(56) References Cited

U.S. PATENT DOCUMENTS

| | | | | | |
|---|---|---|---|---|---|
| 4,177,428 | A | * | 12/1979 | Klank | .......... 455/143 |
| 4,821,003 | A | * | 4/1989 | Kameya | ....... 333/139 |
| 5,453,704 | A | * | 9/1995 | Kawashima | ......... 326/81 |
| 5,594,391 | A | * | 1/1997 | Yoshizawa | .......... 331/57 |
| 5,673,005 | A | * | 9/1997 | Pricer | ........ 331/1 R |
| 6,445,253 | B1 | * | 9/2002 | Talbot | .......... 331/57 |
| 6,459,312 | B2 | * | 10/2002 | Ogawa et al. | ....... 327/153 |
| 6,711,395 | B1 | * | 3/2004 | Tonegawa et al. | ....... 455/313 |
| 2008/0143408 | A1 | * | 6/2008 | Paillet et al. | ....... 327/175 |

* cited by examiner

*Primary Examiner*—An T Luu
(74) *Attorney, Agent, or Firm*—Dana B. Lemoine; Lemoine Patent Services, PLLC

(57) ABSTRACT

The duty cycle of a signal is modified by passing the signal through a plurality of inverting stages. The inverting stages each have bias circuitry to influence the input switching threshold of inverters. Multiple duty cycle modification circuits produce non-overlapping local oscillator signals in a system.

18 Claims, 6 Drawing Sheets

ELECTRICAL SIGNAL DUTY CYCLE MODIFICATION

FIELD

The present invention relates generally to electrical circuits, and more specifically to circuits capable of modifying a duty cycle of an electrical signal.

BACKGROUND

Analog and digital signals may have a "duty cycle." For example, the percentage of time that a signal is above a particular voltage value may be described as the duty cycle of the signal. In various electrical systems, it may be desirable to either increase or decrease the duty of an electrical signal.

DESCRIPTION OF EMBODIMENTS

Figure 1:
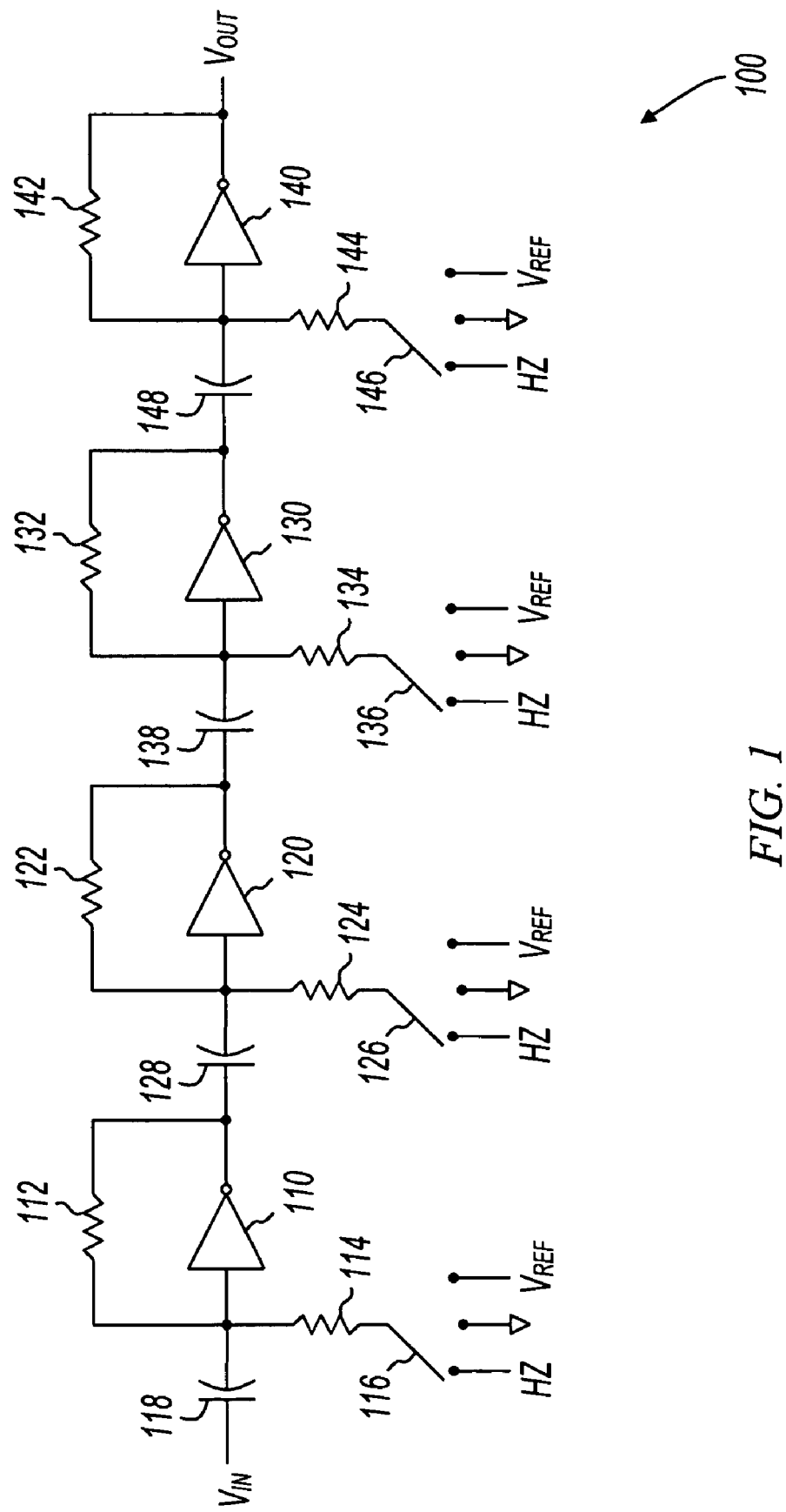
FIGS. 1-3 show diagrams of electrical signal duty cycle modification circuits.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a duty cycle modification circuit. Duty cycle modification circuit 100 receives an input voltage ($V_{IN}$), and produces an output voltage ($V_{OUT}$). In some embodiments, switches within circuit 100 are configured to modify the behavior of cascaded inverting stages, such that $V_{OUT}$ has a similar fundamental frequency component as $V_{IN}$, but a different duty cycle.

Duty cycle modification circuit 100 includes four inverting stages. The first stage includes inverter 110, feedback resistor 112, coupling capacitor 118, resistor 114, and switch 116. A second stage includes inverter 120, feedback resistor 122, coupling capacitor 128, resistor 124 and switch 126. A third stage includes inverter 130, feedback resistor 132, coupling capacitor 138, resistor 134, and switch 136. A fourth stage includes inverter 140, feedback resistor 142, coupling capacitor 148, resistor 144, and switch 146. As shown in FIG. 1, each stage includes an inverter and biasing circuitry to influence an input switching threshold of the inverter.

Inverters 110, 120, 130, and 140 may be implemented using complementary metal oxide semiconductor (CMOS) circuits. For example, each inverter may include an n-channel metal oxide semiconductor (NMOS) transistor and p-channel MOS (PMOS) transistor coupled to form an inverting circuit, but this is not a limitation of the present invention.

Each of the inverting stages shown in FIG. 1 may operate in a similar fashion. The operation of circuit 100 is described with reference to the first stage. Inverter 110 has an input switching threshold that defines the input voltage value at which the output will change state. When switch 116 is either open or in a high impedance (HZ) state, resistor 114 has no current, and the input threshold voltage of inverter 110 remains at its nominal value. When switch 116 is switched to ground, resistor 114 has current flowing from the input of inverter 110 down to ground, and this current also flows through resistor 112. This provides a lowered DC bias on the input node of inverter 110, and causes the input switching threshold to be reduced, resulting in a reduction of the output signal duty cycle. When resistor 114 is coupled to a reference node having a voltage value above the nominal input switching threshold of inverter 110 (shown as $V_{REF}$), current flows from the reference node through resistor 114 to the input node of inverter 110. This provides an increased DC bias on the input node of inverter 110, and causes the input switching threshold to be increased, resulting in an increase of the output signal duty cycle.

As can be seen from the schematic in FIG. 1, by having current flow through resistor 114 either towards the input node of inverter 110 or away from the input node of inverter 110, the input of inverter 110 can be biased either positive or negative relative to the input switching threshold voltage. Depending on the position of switch 116, the duty cycle of the input voltage may be modified to be either larger or smaller. The amount of change in the duty cycle is a function of many variables, including the relative transistor sizes in each inverter, the size of resistor 112, size of resistor 114, relative sizing between different inverters, and the voltage values of the nodes that may be coupled using switch 116.

Switch 116 is shown being capable of coupling resistor 114 to a high impedance (HZ) node, a ground node, and a node with a reference voltage ($V_{REF}$), although the present invention is not limited in this regard. For example, switch 116 may only be capable of coupling resistor 114 between HZ and ground or between HZ and $V_{REF}$. Further, in some embodiments, switch 116 may be capable of coupling resistor 114 between nodes having any voltage potential. For example, switch 116 may be capable of coupling resistor 114 between two nodes, where one has a voltage less than the nominal input switching threshold of inverter 110, and one has a voltage greater than the nominal input switching threshold of inverter 110.

Circuit 100 shows four cascaded AC coupled stages. By controlling switches in the individual stages, the amount of duty cycle modification may be controlled with some amount of precision. In some embodiments, the stages are identical and the switches may be thrown in sequence to incrementally modify the duty cycle of the input voltage waveform. In other embodiments, bias circuits of the various stages are different. For example, resistors 114, 124, 134, and 144 may have different resistance values so as to allow a weighted effect of throwing the various switches. For example, each of the resistors may have binary weights such that the four stages shown may provide sixteen possible combinations of duty cycle modification.

In some embodiments, alternating stages include differing bias circuits. For example, the first and third stages may include bias circuits capable of switching a resistor to a voltage below the nominal input switching threshold of the corresponding inverter, and the second and fourth stages may include bias circuits capable of switching a resistor to a voltage above the nominal input switching threshold of the corresponding inverter. Although FIG. 1 shows four stages, this is not a limitation of the present invention. For example, circuit 100 may have more or less than four stages.

Figure 2:
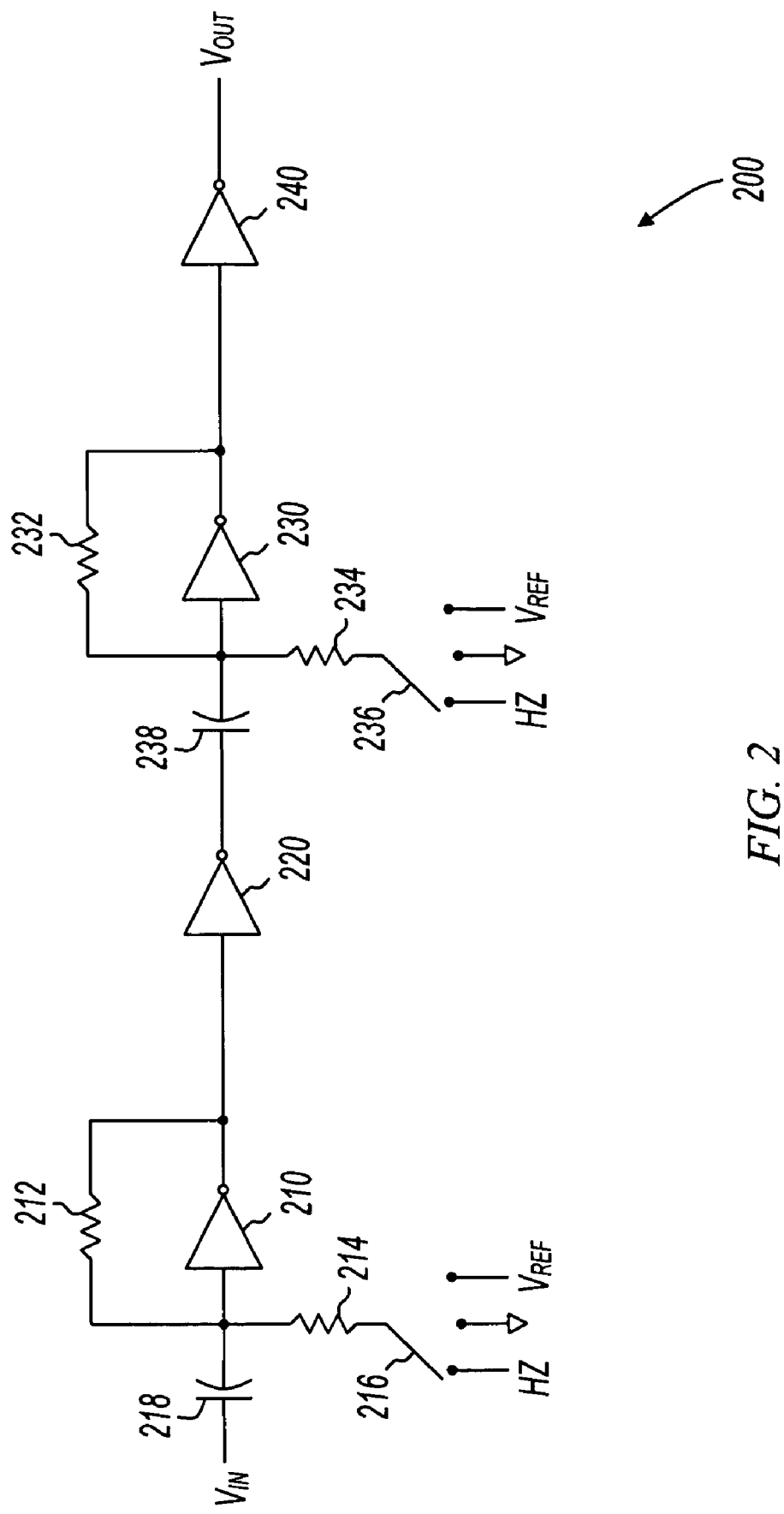

FIG. 2 shows a duty cycle modification circuit. Duty cycle modification circuit 200 includes two AC coupled stages. The first stage includes inverters 210 and 220, resistor 212, resistor 214, switch 216, and capacitor 218. The second stage includes inverters 230 and 240, resistor 232, resistor 234, switch 236, and capacitor 238. The circuit shown in FIG. 2 is similar to that shown in FIG. 1 with the exception that alternating inverters operate as inverting buffers and do not include bias circuitry to modify the input voltage switching threshold.

Figure 3:
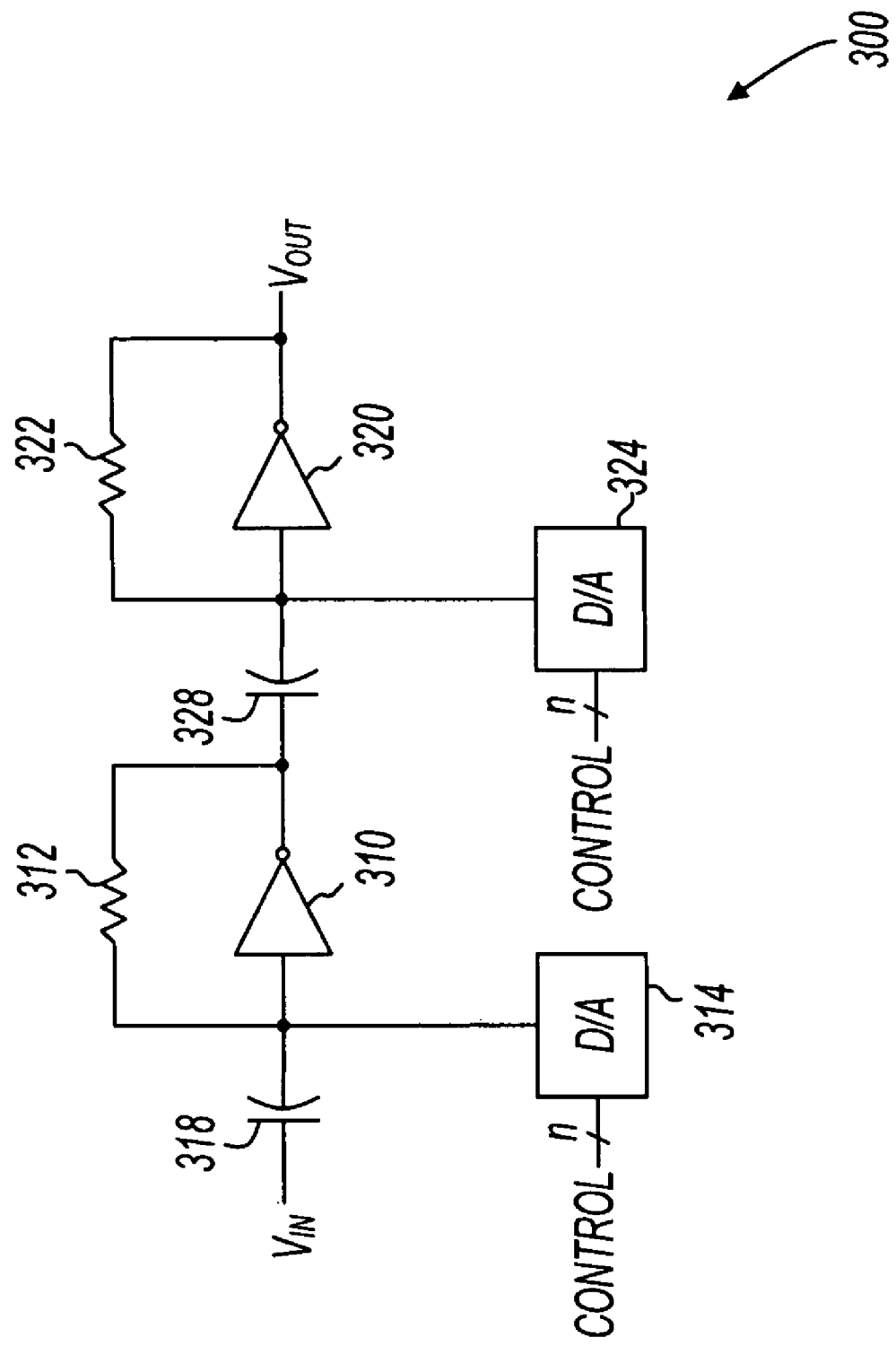

FIG. 3 shows duty cycle modification circuit. Duty cycle modification circuit 300 includes two stages, although any number of stages may be utilized. A first stage includes inverter 310, resistor 312, capacitor 318, and digital-to-analog converter 314. A second stage includes inverter 320, resistor 322, capacitor 328, and digital-to-analog converter 324. Digital-to-analog converters 314 and 324 receive a multi-bit control word and produce an output current that is coupled to the input of either inverter 310 or inverter 320. Each of digital-to-analog converters 314 and 324 may either source or sink current. By influencing a bias voltage coupled to the input nodes of the inverters, digital-to-analog converters 314 and 324 can modify the input switching threshold of the inverters, and modify the duty cycle of the electrical signal passing through circuit 300. Digital-to-analog converters 314 and 324 may be single bit converters or multi-bit converters.

Figure 4:
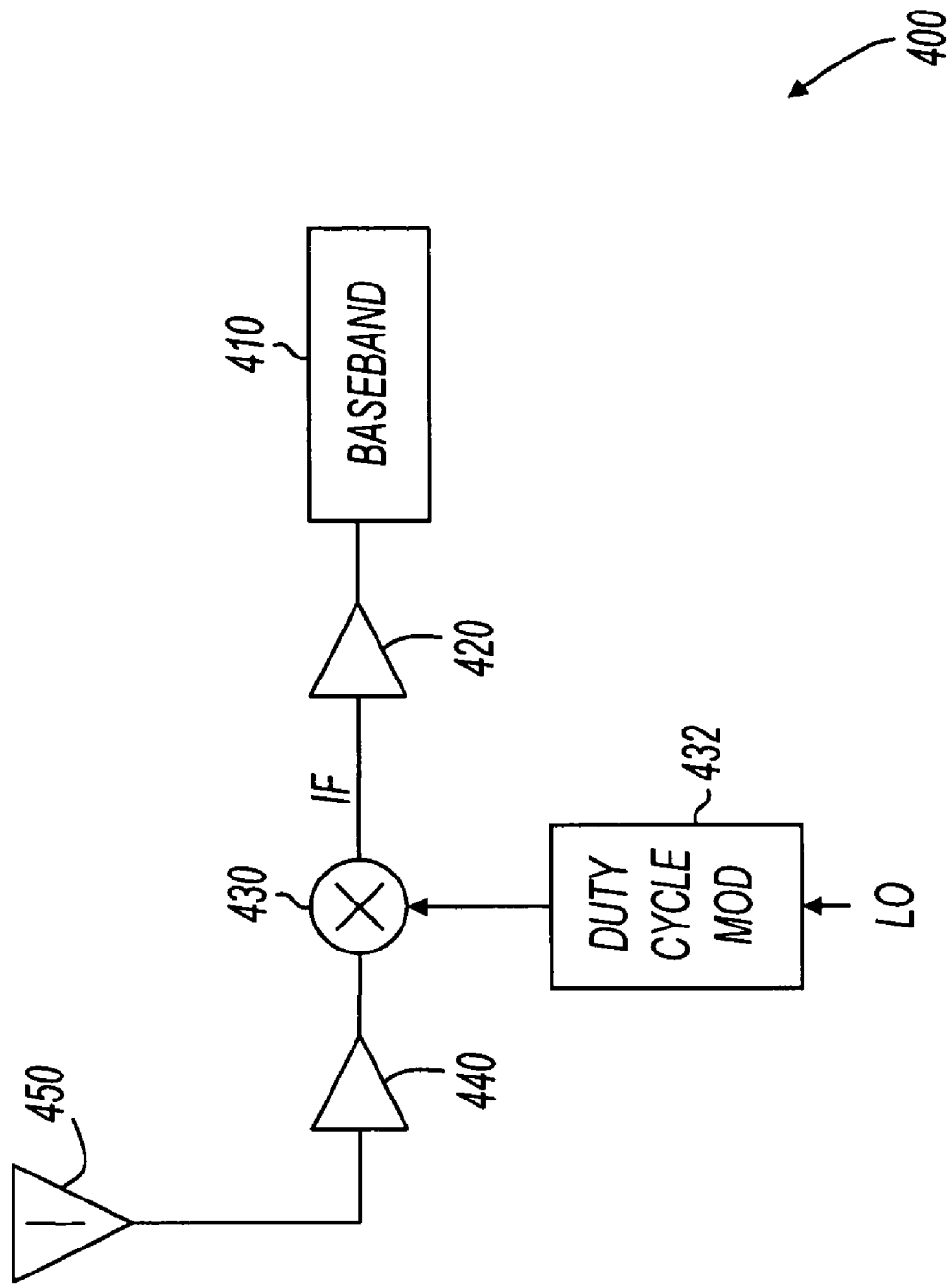
FIG. 4 shows a diagram of an electronic system in accordance with various embodiments of the present invention.

FIG. 4 shows a system diagram in accordance with various embodiments of the present invention. Electronic system 400 includes antenna 450, low noise amplifier (LNA) 440, mixer 430, duty cycle modification circuit 432, amplifier 420, and baseband processing circuit 410, which may include an analog-to-digital converter. In operation, system 400 sends and receives signals using antenna 450, and the signals are processed by the various elements shown in FIG. 4.

Antenna 450 may include one or more antennas. For example, antenna 450 may include a single directional antenna or an omni-directional antenna. As used herein, the term omni-directional antenna refers to any antenna having a substantially uniform pattern in at least one plane. For example, in some embodiments, antenna 450 may include a single omni-directional antenna such as a dipole antenna, or a quarter wave antenna. Also for example, in some embodiments, antenna 450 may include a single directional antenna such as a parabolic dish antenna or a Yagi antenna. In still further embodiments, antenna 450 may include multiple physical antennas. For example, in some embodiments, multiple antennas are utilized for multiple-input-multiple-output (MIMO) processing or spatial-division multiple access (SDMA) processing.

LNA 440 receives radio frequency (RF) signals from antenna 450 and provides amplified RF signals to mixer 430 for frequency conversion. Mixer 430 provides an intermediate frequency (IF) signal to amplifier 420, which then provides signals to baseband circuitry 410 for further processing. System 400 may include further frequency conversion circuitry or filtering, depending on the application and desired characteristics of system 400.

Duty cycle modification circuit 432 may one or more of the duty cycle modification circuits (or their equivalents) shown in FIGS. 1-3. Duty cycle modification circuit 432 receives a local oscillator (LO) signal, and conditionally modifies the duty cycle of the LO signal prior to providing the LO signal to mixer 430. In some embodiments, the LO signal is differential, and duty cycle modification circuit 432 includes more than one circuit to modify the duty cycle of the LO signal.

Example systems represented by FIG. 4 include cellular phones, personal digital assistants, wireless local area network interfaces, and the like. Many other systems uses for duty cycle modification circuits exist. For example, duty cycle modification circuit 432 may be used in a desktop computer, a network bridge or router, or any other system without an antenna.

Although the various elements of system 400 are shown separate in FIG. 4, embodiments exist that combine the circuitry of amplifiers 420 and 440, mixer 430, duty cycle modification circuit 432, and all or a portion of baseband circuitry 410 in a single integrated circuit. For example, mixer 430 and duty cycle modification circuit 432 may be combined together on an integrated circuit die. In some embodiments, the various elements of system 400 may be separately packaged and mounted on a common circuit board. In other embodiments, the various elements are separate integrated circuit dice packaged together, such as in a multi-chip module, and in still further embodiments, various elements are on the same integrated circuit die.

Figure 5:
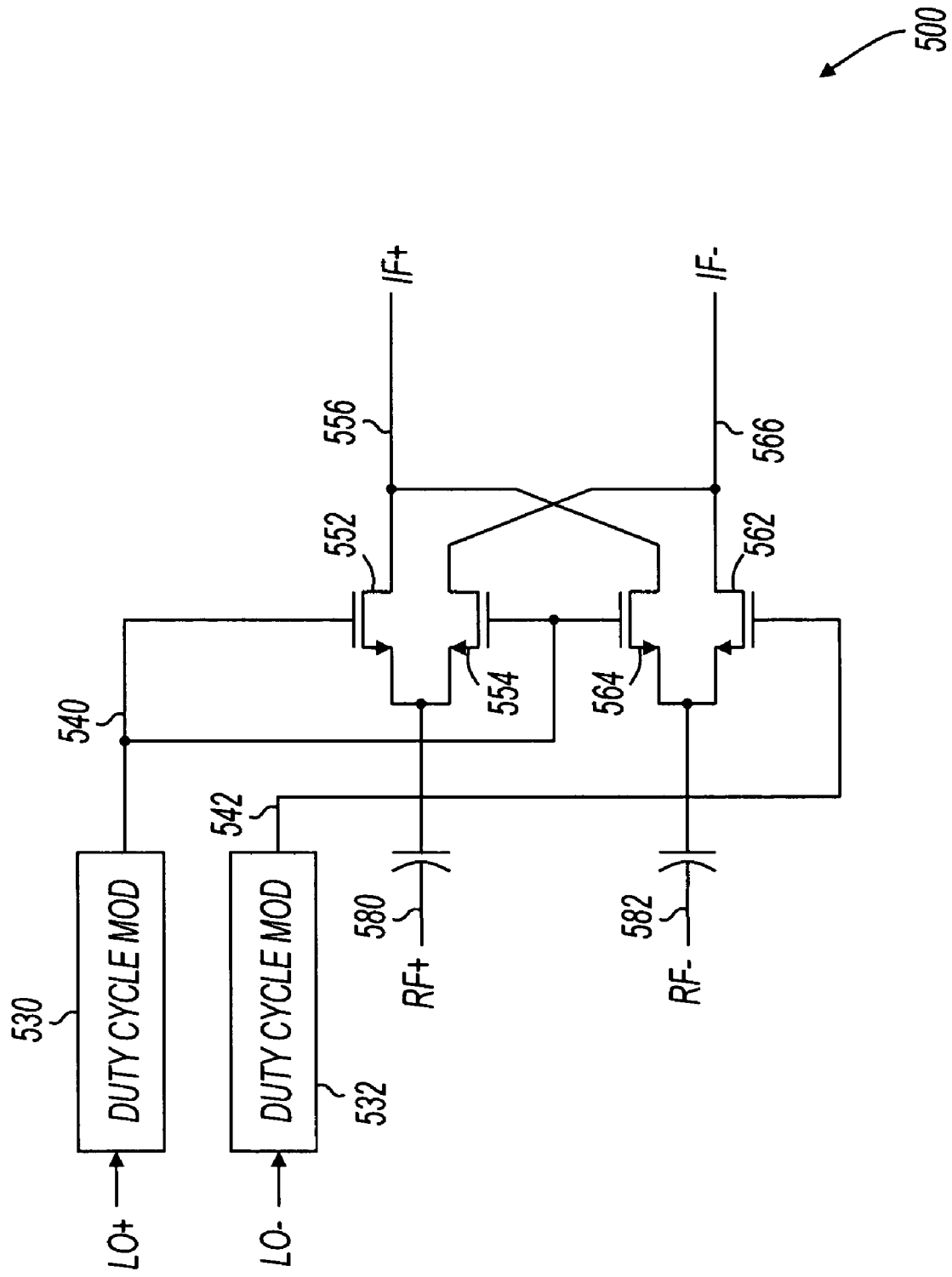
FIG. 5 shows a mixer circuit having local oscillator signals subject to duty cycle modification.

FIG. 5 shows a mixer circuit having local oscillator signals subject to duty cycle modification. Mixer circuit 500 includes transistors 552, 554, 562, and 564. A differential radio frequency (RF) signal is driven on nodes 580 and 582, which are coupled to source nodes of transistors 552, 554, 562, and 564. A differential local oscillator (LO) signal is driven on nodes 530 and 532, which are input to duty cycle modification circuits 530 and 532, respectively. The duty-cycle-modified LO signals are then coupled to the gate nodes of the transistors. Mixer 500 produces a differential intermediate frequency (IF) output on nodes 556 and 566. Nodes 556 and 566 may be coupled to another amplifier such as a transimpedance amplifier with low input impedance.

In some embodiments, duty cycle modification circuits 530 and 532 operate to create non-overlapping LO signals on nodes 540 and 542. For example, if the duty cycle of both LO+ and LO− is reduced, then LO+ and LO− will not overlap. The amount of overlap or non-overlap can be controlled using the various control means described above with respect to FIGS. 1-3. Non-overlapping local oscillator signals may improve the noise figure (sensitivity) of receivers by reducing the noise contributed by the mixer and baseband amplifier.

Duty cycle modification circuits and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of biased mixer circuit 500 may be represented as polygons assigned to layers of an integrated circuit.

Figure 6:
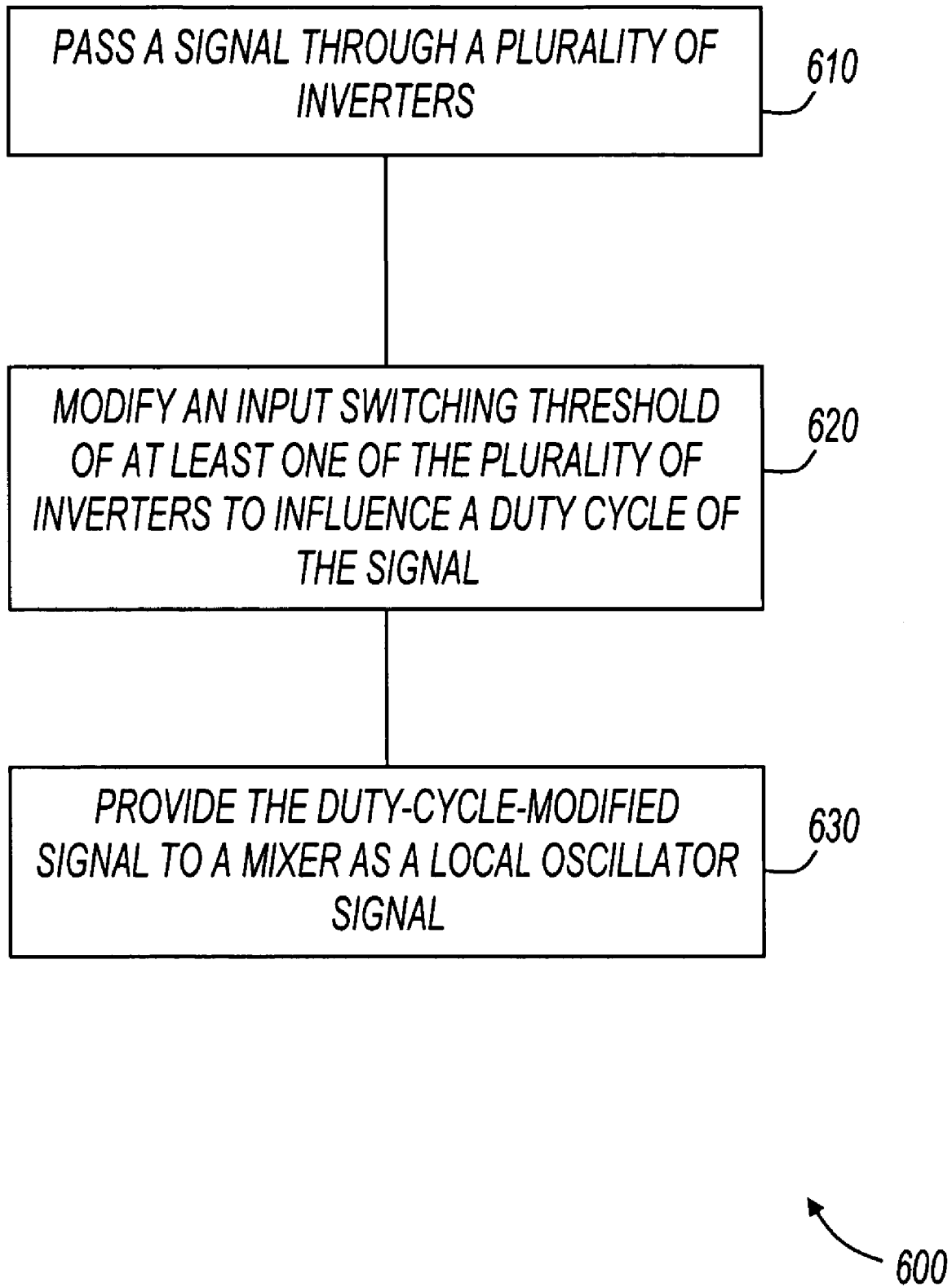
FIG. 6 shows a flowchart in accordance with various embodiments of the present invention.

FIG. 6 shows a flowchart in accordance with various embodiments of the present invention. In some embodiments, method 600, or portions thereof, is performed by a duty cycle modification circuit, embodiments of which are shown in previous figures. In other embodiments, method 600 is performed by an integrated circuit or an electronic system. Method 600 is not limited by the particular type of apparatus performing the method. The various actions in method 600 may be performed in the order presented, or may be performed in a different order. Further, in some embodiments, some actions listed in FIG. 6 are omitted from method 600.

Method 600 is shown beginning with block 610 in which a signal in passed through a plurality of inverters. The plurality of inverters correspond to cascaded inverting stages such as those shown in FIGS. 1-3. At 620, an input switching threshold of at least one of the plurality of inverters is modified to influence a duty cycle of the signal. In some embodiments, this may correspond to setting switches in bias circuits (FIGS. 1,2), or setting control words for digital-to-analog converters (FIG. 3).

At 630, the duty-cycle modified signal is provided to a mixer as a local oscillator signal. The local oscillator signal may be single ended or differential. In some embodiments, both complementary signals in a differential pair are subject to method 600, and non-overlapping differential LO signals result as described above with reference to FIG. 5.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A circuit comprising:
   a plurality of inverting stages, wherein each of the plurality of inverting stages includes an inverter and bias circuitry to influence an input switching threshold of the inverter, and wherein the bias circuitry includes a feedback resistor coupled between an input node of the inverter and an output node of the inverter, and a second resistor coupled to the input of the inverter; and
   a switch coupled to the second resistor, wherein the switch is operable to couple the second resistor to at least one voltage potential.

2. The circuit of claim 1 wherein the switch is operable to couple the second resistor to either a voltage potential below a nominal input switching threshold voltage or a voltage potential above the nominal input switching threshold voltage.

3. The circuit of claim 1 further comprising capacitors coupled between the plurality of inverting stages.

4. The circuit of claim 1 wherein the second resistor of each inverting stage has a different value.

5. The circuit of claim 1 wherein the bias circuitry comprises a digital-to-analog converter coupled to an input node of the inverter.

6. A circuit comprising:
   a plurality of inverting stages, wherein each of the plurality of inverting stages includes an inverter and bias circuitry to influence an input switching threshold of the inverter, wherein the bias circuitry comprises a digital-to-analog converter coupled to an input node of the inverter and a resistor coupled between the input node of the inverter and an output node of the inverter.

7. The circuit of claim 6 wherein the digital-to-analog converter comprises a one-bit digital-to-analog converter.

8. The circuit of claim 6 wherein the digital-to-analog converter comprises a multi-bit digital-to-analog converter.

9. A circuit comprising:
   a plurality of inverting stages, wherein each of the plurality of inverting stages includes an inverter and bias circuitry to influence an input switching threshold of the inverter, wherein the bias circuitry comprises a digital-to-analog converter coupled to an input node of the inverter, and wherein each of the plurality of inverting stages has an AC coupled input.

10. A system comprising:
    an antenna; and
    a mixer circuit coupled to receive a signal from the antenna, and at least one duty cycle modification circuit to modify a duty cycle of a local oscillator signal prior to providing the local oscillator signal to the mixer circuit, the at least one duty cycle modification circuit comprising a plurality of inverting stages, wherein each of the plurality of inverting stages includes an inverter and bias circuitry to influence an input switching threshold of the inverter, wherein the bias circuitry includes a feedback resistor coupled between an input node of the inverter and an output node of the inverter, a second resistor coupled to the input of the inverter, and a switch coupled to the second resistor, wherein the switch is operable to couple the second resistor to at least one voltage potential.

11. The system of claim 10 wherein the switch is operable to couple the second resistor to either a voltage potential below a nominal input switching threshold voltage or a voltage potential above the nominal input switching threshold voltage.

12. The system of claim 10 further comprising capacitors coupled between the plurality of inverting stages.

13. The system of claim 10 wherein the second resistor of each inverting stage has a different value.

14. A system comprising:
    an antenna; and
    a mixer circuit coupled to receive a signal from the antenna, and at least one duty cycle modification circuit to modify a duty cycle of a local oscillator signal prior to providing the local oscillator signal to the mixer circuit, the at least one duty cycle modification circuit comprising a plurality of inverting stages, wherein each of the plurality of inverting stages includes an inverter and bias circuitry to influence an input switching threshold of the inverter, wherein the bias circuitry includes a feedback resistor coupled between an input node of the inverter and an output node of the inverter, a second resistor coupled to the input of the inverter, and a digital-to-analog converter coupled to an input node of the inverter.

15. The system of claim 14 further comprising capacitors coupled between the plurality of inverting stages.

16. The system of claim 14 wherein the second resistor of each inverting stage has a different value.

17. The system of claim 14 wherein the digital-to-analog converter comprises a one-bit digital-to-analog converter.

18. The system of claim 14 wherein the digital-to-analog converter comprises a multi-bit digital-to-analog converter.

* * * * *